United States Patent [19]

Shibuya

[11] 4,247,952
[45] Jan. 27, 1981

[54] SIGNAL RECEIVING APPARATUS

[75] Inventor: Michio Shibuya, Yokohama, Japan

[73] Assignee: Sony Corporation, Tokyo, Japan

[21] Appl. No.: 938,384

[22] Filed: Aug. 31, 1978

[30] Foreign Application Priority Data

Aug. 31, 1977 [JP] Japan .............................. 52-104534

[51] Int. Cl.³ .............................................. H04B 1/16
[52] U.S. Cl. .................................. 455/186; 455/194; 455/199; 455/200
[58] Field of Search ............... 325/453, 459, 464, 468, 325/470, 427, 457; 455/150, 179, 182, 185, 186, 194, 197, 199, 200, 266

[56] References Cited

U.S. PATENT DOCUMENTS

| 2,252,098 | 8/1941 | Röhr | 325/427 |
| 4,110,694 | 8/1978 | Wilhelm | 325/464 |
| 4,130,804 | 12/1978 | Mogi et al. | 325/464 |

Primary Examiner—Marc E. Bookbinder
Attorney, Agent, or Firm—Lewis H. Eslinger; Alvin Sinderbrand

[57] ABSTRACT

Improvements in signal receiving apparatus of the type including a tuning stage having a presettable channel selecting storage device for storing selected channel identity signals representing predetermined channels to which the tuning stage is tunable and wherein any of the stored channel identity signals is selectively read out so as to control the tuning stage to be tuned to the channel represented by the read out channel identity signal. The improvements comprise a presettable memory device for storing control signals associated with the respective predetermined channels, these control signals being used to control at least one operating condition of the signal receiving apparatus. A selectively operable preset circuit generates at least one control signal for storage in the memory device when the tuning stage is tuned to an associated channel during a preset operation. A particular stored channel identity signal is read out from the storage device and, concurrently therewith, at least one control signal associated with the channel represented by the read out channel identity signal is read out of the memory device. The read out channel identity signal determines the channel to which the tuning stage is tuned, and the read out control signal, or signals, determines the operating condition of the signal receiving apparatus for that channel.

11 Claims, 5 Drawing Figures

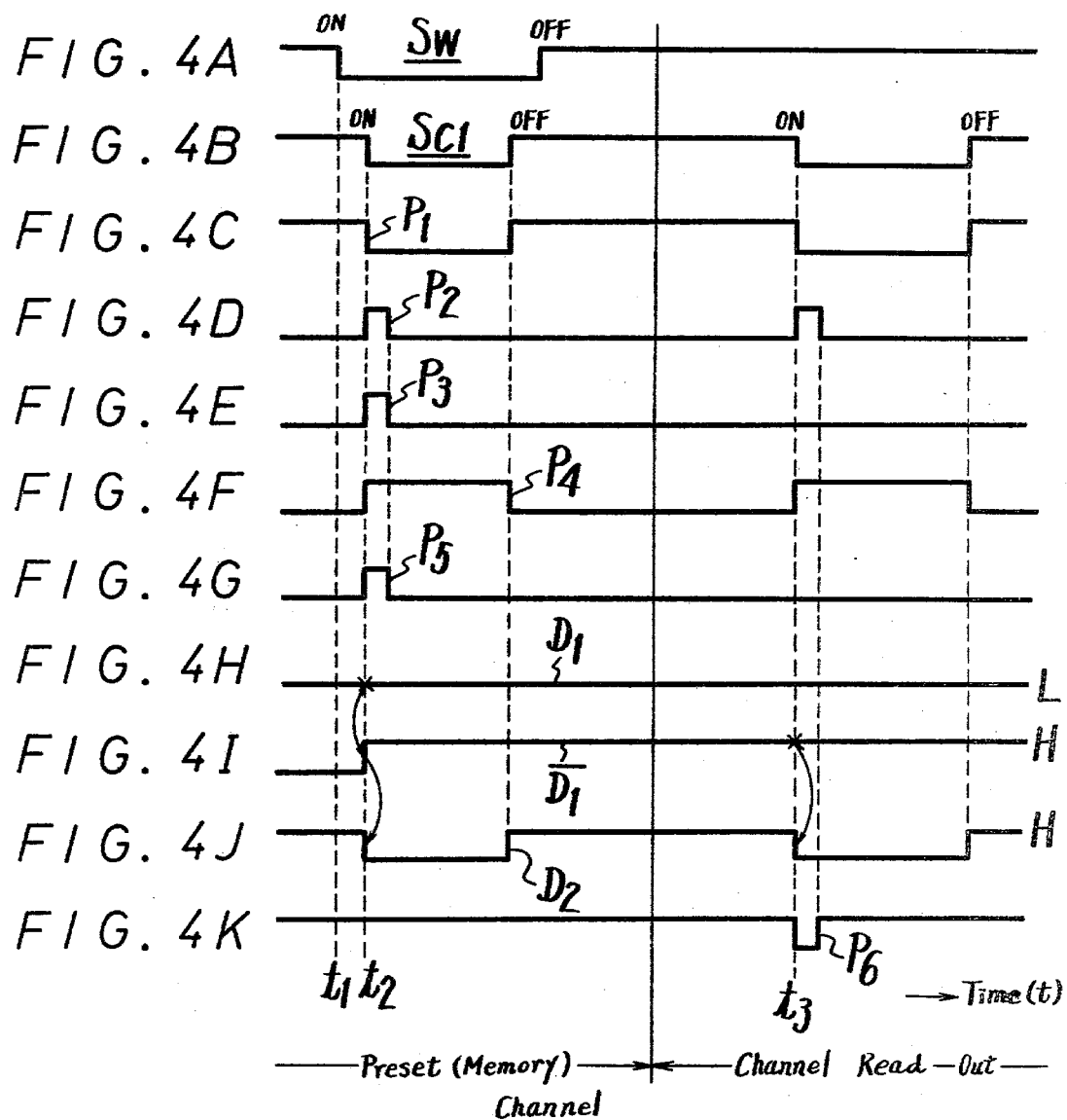

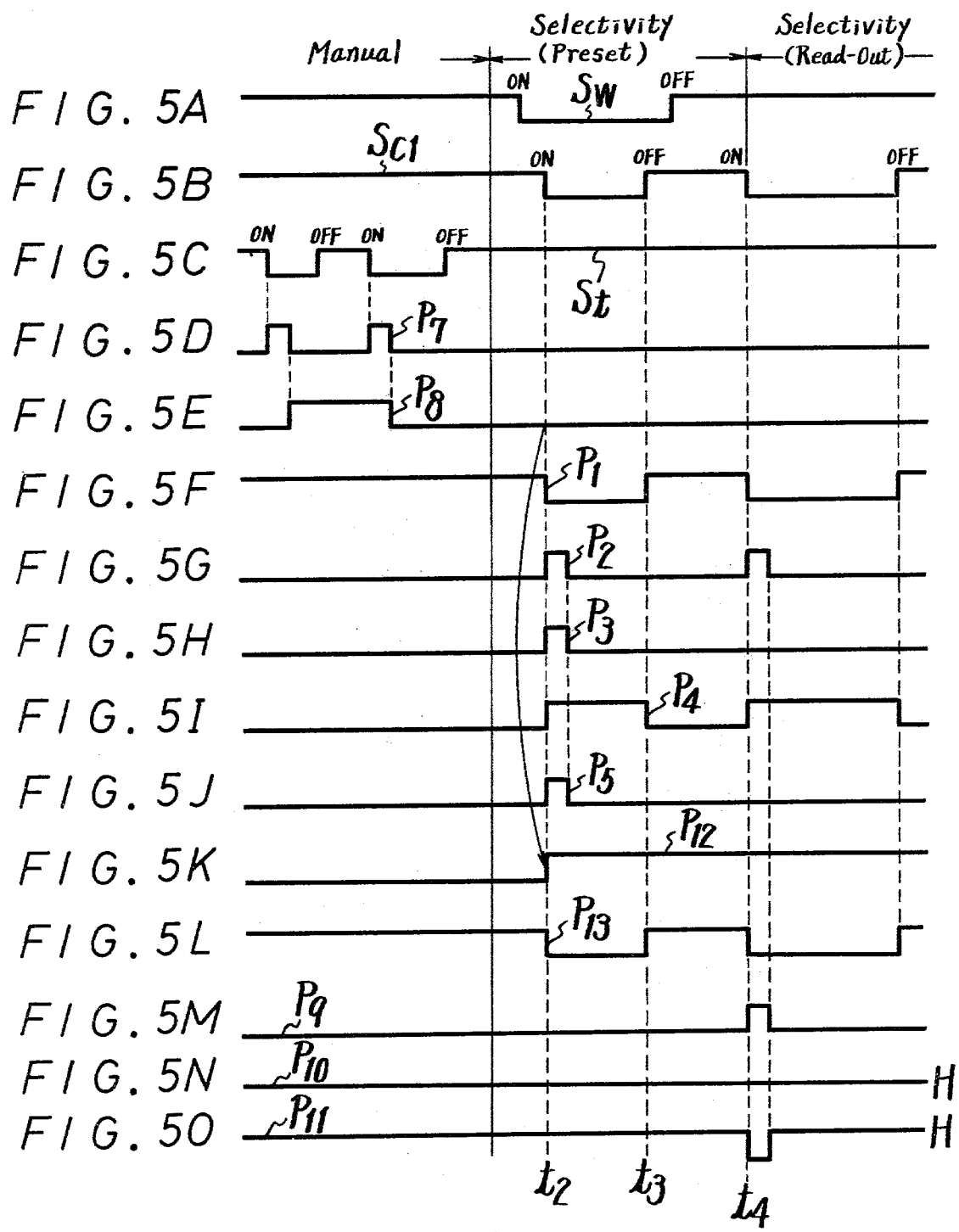

SIGNAL RECEIVING APPARATUS

BACKGROUND OF THE INVENTION

This invention relates to signal receiving apparatus of the type which is capable of receiving broadcasted radio signals and which is provided with a storage device for storing preset channel identity signals representing particular channels to which the apparatus is tuned and, more particularly, to such apparatus which additionally is provided with a memory device for storing preset control signals which are associated with the particular channels identified by the stored, preset channel identity signals, which control signals are used to establish desired operating conditions of the signal receiving apparatus for each such channel.

In typical radio receiving apparatus, such as the type which is adapted to receive FM and/or AM signals, a tuning section is provided wherein a variable frequency local oscillating signal is mixed with an incoming radio signal to produce an intermediate frequency (IF) signal from which the received, broadcasted information is demodulated. Heretofore, the frequency of the local oscillating signal is varied by varying one or more reactive elements, such as an air capacitor, which is included in the local oscillator circuitry. In an improvement over this apparatus, the usual mechanically-operable air capacitor has been replaced by a voltage-controlled reactance device, such as a voltage-controlled capacitor, known as a varicap diode. By avoiding the use of mechanical elements in the tuning section, it is possible to employ digital techniques for controlling the voltage-controlled capacitor and, thus, to select a desired tuning condition for the signal receiving apparatus.

A tuning section which relies on digital techniques, as aforesaid, may include a voltage-controlled oscillator (VCO), a programmable frequency divider for dividing the frequency of the oscillating signal generated by the VCO by a programmable frequency dividing ratio, a phase comparator for comparing the phase of the frequency-divided oscillating signal with a reference signal of constant frequency and phase, and a feedback loop for feeding back the phase error produced by the phase comparator so as to determine the frequency of the VCO accordingly. As the dividing ratio of the programmable frequency divider changes, the frequency of the frequency-divided oscillating signal supplied to the phase comparator correspondingly changes. This, in turn, results in a change in the fed back error signal so as to modify the frequency of the oscillating signal. The frequency dividing ratio can be established by, for example, a digital code. Therefore, the tuning condition of the tuning section can be determined as a function of this digital code.

The digital code corresponding to a particular broadcasted frequency, or channel, is used as a channel identity code. If a number of these channel identity codes are stored, the tuning section can be tuned rapidly to a predetermined channel merely by reading out the desired code and supplying this code to the programmable frequency divider. This code initially can be derived, or preset, by incrementing or decrementing a digital counter during a so-called set-up operation. The contents of this counter are supplied to the programmable frequency divider so that as this count changes, the tuning condition of the tuning section is swept across the broadcast frequency spectrum. When a desired frequency, or channel, is received, the counter is maintained at its then-existing count, thus establishing the frequency divider ratio of the programmable frequency divider. This count then can be stored in a storage device, or at a particular location in a memory device, which can be addressed for future read out.

While a system of the aforedescribed type may operate satisfactorily to tune the tuning section to particular ones of various predetermined channels, the operating condition of the receiving apparatus in which the tuning section is provided nevertheless may be less than optimum. As is known, in radio receiving apparatus for receiving stereophonic broadcasts of high fidelity, various control elements may be provided in order to adjust the operating conditions of the apparatus for the satisfactory reception of weak signals. Thus, a selectivity control element may be provided for narrowing the frequency band of, for example, the IF stage. This improves the selectivity of the receiving apparatus by limiting the output of the IF stage to a relatively narrow frequency spectrum centered on the desired broadcast frequency which may be adjacent an undesired broadcast frequency. Hence, by narrowing the frequency band, and thus improving the selectivity, interference due to the undesired adjacent broadcast frequency is avoided. Of course, in the absence of an interfering adjacent broadcast frequency, the frequency band of the IF stage preferably is enlarged to a normal range.

Another control element which, preferably, is provided is a mode selecting element. The mode selecting element is operable to change over the operation of the radio receiving apparatus from, for example, a stereo mode to a monaural mode. In the stereo mode, the usual demodulator, which may be a multiplex (MPX) stereo demodulator, is operated to demodulate and combine the usual mono signal (formed of the sum of the left and right channels L+R) and the stereo signal (formed of the difference between the left and right channels L−R) to produce separate channel information. In the mono operating mode, the demodulator merely demodulates the mono (L+R) signal and supplies this demodulated mono signal to each speaker. If the received broadcast signal is relatively weak, the stereo signal, which is modulated onto a higher subcarrier, may be accompanied by undesired interference. Hence, if the demodulator is operated in its stereo mode, the reproduced signals may be less favorable than if the demodulator is operated in its mono mode. The mode control element permits the user of the receiving apparatus to select the particular mode which is most favorable to him.

Yet another control element which may be provided in the radio receiving apparatus is a muting element. Depending upon the strength of the received broadcast signal, as well as the strength of signals which are broadcasted over adjacent frequencies, a more favorable operating condition is attained in some instances when the muting element is operated to permit a muting operation to be performed; while in other instances, a more favorable condition may exist when the muting operation is not performed.

In radio receiving apparatus of the type described hereinabove wherein a storage or memory circuit is provided to store preset channel identity codes, the reading out of a particular channel identity code, although effective to establish a particular tuning condition of the tuning section, has no effect upon the particular selectivity, mode and muting conditions of the receiving apparatus. For example, for optimum reception of the broadcasted program identified as channel 1, the selectivity function should be "narrow", the mode should be "stereo" and the muting operation should be "on". When channel 1 is selected for reception, these conditions may not be present. Thus, the user must operate the aforementioned control elements in order to obtain the optimum receiving conditions. As another example, if the broadcasted program associated with channel 2 is selected, the optimum receiving conditions for this program may be a "wide" selectivity, a mono mode and the muting operation should be "off". In order to provide these conditions, the user must operate the control elements to achieve these individual functions.

Thus, the advantage of so-called "one button" tuning is not attained by the aforedescribed apparatus. That is, although the operation of a single "button" will tune the tuning section to a corresponding preset channel, the operating conditions of the receiving apparatus may not be correct for that channel. Therefore, it is desirable for the user to determine the proper operating conditions of the signal receiving apparatus during the initial, or set-up, operation, whereby control signals representing these proper operating conditions can be stored with the channel identity code. When a particular channel is selected, the preset channel identity code and control signals are read out of the storage device and used to tune the tuning section to the preset channel and also to establish the optimum operating conditions of the receiving apparatus for that channel.

OBJECTS OF THE INVENTION

Therefore, it is an object of the present invention to provide improved signal receiving apparatus which avoids the defects and disadvantages which have been noted hereinabove.

Another object of this invention is to provide radio signal receiving apparatus including a tuning stage which can be presettable to predetermined, desired channels, and wherein the preferred operating conditions of the receiving apparatus for such channels can be preset so as to be achieved when a desired channel is selected.

A further object of this invention is to provide radio signal receiving apparatus including a tuning stage having a presettable channel storage device for storing selected channel identity signals representing predetermined chanels to which the tuning stage can be tuned, and further including a presettable memory device for storing control signals associated with the stored channel identity signals for controlling one or more operating conditions of the signal receiving apparatus when a particular channel is selected.

An additional object of this invention is to provide radio signal receiving apparatus of the aforedescribed type wherein the preset channel identity signals and the preset control signals are selected during a set-up operation, and thereafter are read out of the storage and memory devices whenever the channel associated therewith is to be received.

Yet another object of this invention is to provide radio signal receiving apparatus of the aforedescribed type wherein the control signals are adapted to control one or more of the selectivity, mono/stereo and muting operating conditions of the receiving apparatus.

A still further object of this invention is to provide radio signal receiving apparatus of the aforedescribed type wherein digital techniques are used to produce the preset channel selecting signals and control signals, to store such signals and to read out those signals for controlling the tuning and operating conditions of the receiving apparatus.

Various other objects, advantages and features of the present invention will be readily apparent from the ensuing detailed description, and the novel features will be particularly pointed out in the appended claims.

SUMMARY OF THE INVENTION

In accordance with this invention, signal receiving apparatus of the type including a tuning stage having a presettable channel selecting storage device is provided. The storage device is adapted to store selected channel identity signals representing predetermined channels to which the tuning stage is tunable. Any of the stored channel identity signals can be selectively read out of the storage device in order to set the tuning stage to a tuning condition corresponding to the channel represented by the read out channel identity signal. A presettable memory device is provided for storing control signals associated with the respective predetermined channels. The control signals stored in the memory device are used to control at least one operating condition of the signal receiving apparatus, such as the selectivity, mono/stereo mode or muting operation. The control signals are generated during a set-up operation when the tuning stage initially is tuned to associated channels. During subsequent operation of the apparatus, a particular stored channel identity signal and a corresponding control signal are read out of the storage and memory devices, respectively, so as to tune the tuning stage to the channel represented by the read out channel identity signal and to establish the desired, preset operating conditions of the signal receiving apparatus for the optimum reception of that channel.

BRIEF DESCRIPTION OF THE DRAWINGS

The following detailed description, given by way of example, will best be understood in conjunction with the accompanying drawings in which:

FIGS. 4A-4K and 5A-5O are waveform diagrams which are useful in understanding the operation of the embodiment shown in FIG. 3.

DETAILED DESCRIPTION OF A PREFERRED EMBODIMENT

Figure 1:
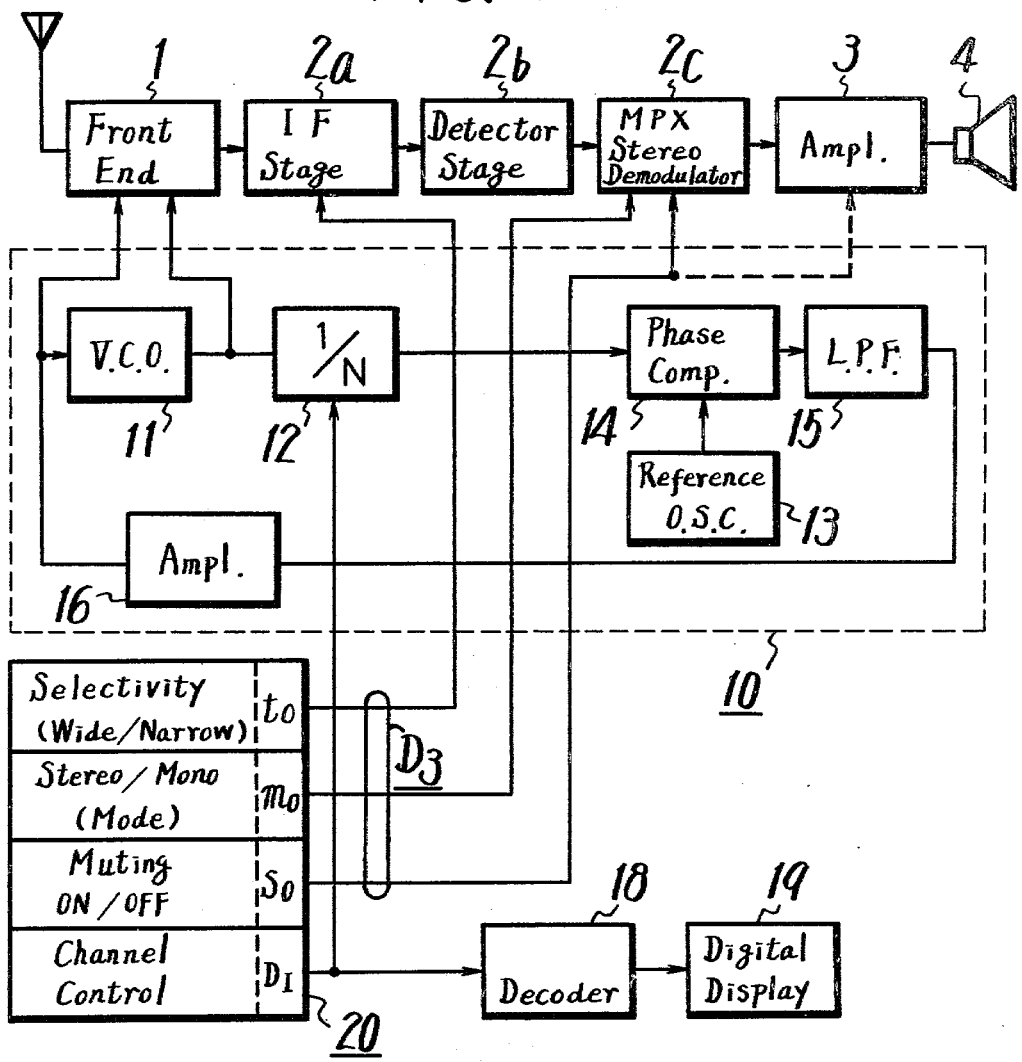
FIG. 1 is a block diagram showing one embodiment of signal receiving apparatus which incorporates the present invention.

Referring now to the drawings, and in particular to FIG. 1, an embodiment of radio signal receiving apparatus incorporating the present invention is shown. The signal receiving apparatus includes a front end 1, an intermediate frequency (IF) stage 2a, a detector stage 2b, a demodulator 2c, an amplifier 3 and a transducer, such as a speaker 4. Front end section 1 includes the usual RF amplifier and mixer circuits, normally provided in radio receiving apparatus in order to convert a received radio frequency signals, such as an FM or an AM signal, to an IF signal. The output of front end section 1 is coupled to IF stage 2a wherein the IF signal is amplified. Additionally, the selectivity of the IF stage is adapted to be controlled such that the effective frequency band thereof can be made either broad or narrow. If the effective frequency band of the IF stage is made relatively narrow, interference that may be attributed to an adjacent broadcasted frequency is avoided. This, of course, improves the selectivity of the signal receiving apparatus. If there is no interference from an adjacent broadcast frequency, the effective frequency band of IF stage 2a preferably is made relatively broad so as to correspondingly increase the useful frequency spectrum of the amplified IF signal.

Detector stage 2b is coupled to the output of IF stage 2a and is adapted to detect the modulated signal information, such as the modulated audio signals, from the IF stage. The output of detector stage 2b is coupled to demodulator stage 2c. This demodulator is a multiplex (MPX) stereo demodulator for demodulating a received composite stereo signal into separate channels. Typically, a composite stereo signal includes a monaural signal which, conventionally, is constituted by the summation of left (L) and right (R) channel information (L+R). The composite stereo signal also includes a pilot signal together with a stereo component (L−R) which is the difference between the left and right channel information signals. The stereo component is modulated onto a harmonic of the pilot signal such that the pilot signal readily can be used to demodulate this stereo component. Demodulator 2c includes sum and difference circuits for combining the monaural and stereo components to produce separate left (L) and right (R) channel signals, respectively. These left and right channel signals are amplified by amplifier 3, coupled to demodulator 2c, and the amplified signals drive a loudspeaker system, represented herein as loudspeaker 4.

In some instances, interference may accompany the aforementioned stereo component such that when it is combined with the monaural component, the resultant left and right channel signals are degraded. To avoid this effect, demodulator 2c may be operated in its monaural demodulating mode. In such a mode of operation, only the monaural signal (L+R) is supplied to amplifier 3, and thence to the loudspeaker system. Also, other instances may exist wherein, for proper operation of the illustrated signal receiving apparatus, a muting operation should be performed; while in still other instances, this muting operation should be inhibited. Suitable muting circuitry may be provided either in demodulator 2c or in amplifier 3. Selective control over this muting circuit results either in the performance or absence of the muting operation.

As is known, in order to receive a program broadcasted over a particular frequency, that is, broadcasted via a particular channel, the received RF signal must be mixed with a local oscillating signal. The particular broadcast frequency, or channel, which ultimately is demodulated is a function of the frequency of the local oscillating signal. Thus, as the frequency of this local oscillating signal changes, the tuning condition of the receiving apparatus likewise changes. A synthesizer 10 is provided to generate a desired local oscillating frequency so as to tune the illustrated apparatus to a corresponding broadcast frequency. The combination of front end section 1 and synthesizer 2 constitutes the usual tuning section in a radio signal receiver. Synthesizer 10 is comprised of a digitally-controlled phase locked loop formed of a voltage controlled oscillator (VCO) 11, a programmable frequency divider 12, a reference oscillator 13, a phase comparator 14 and a feedback loop formed of a low pass filter 15 and an amplifier 16. VCO 11 generates an oscillating signal whose frequency is determined by a control voltage supplied thereto. This oscillating signal is supplied to front end section 1 whereat it is mixed with the incoming RF signal, thereby producing the IF signal. The local oscillating signal additionally is supplied to programmable frequency divider 12. This programmable frequency divider is adapted to divide the frequency of the local oscillating signal by an amount determined by a coded control signal. This coded control signal is a digital signal whose value establishes the frequency dividing ratio of divider 12.

The frequency divided local oscillating signal derived from programmable frequency divider 12 is supplied to phase comparator 14 whereat its phase is compared to that of a reference signal generated by reference oscillator 13. Reference oscillator 13 is adapted to generate a reference oscillating signal of substantially fixed frequency and phase. Any phase differential between the frequency divided local oscillating signal and the reference signal appears as an error signal which is filtered by low pass filter 15 and supplied as an amplified DC control signal to VCO 11 by amplifier 16. The frequency of the local oscillating signal generated by VCO 11 is changed, that is, either increased or decreased, until the phase error is reduced to zero.

Figure 3:
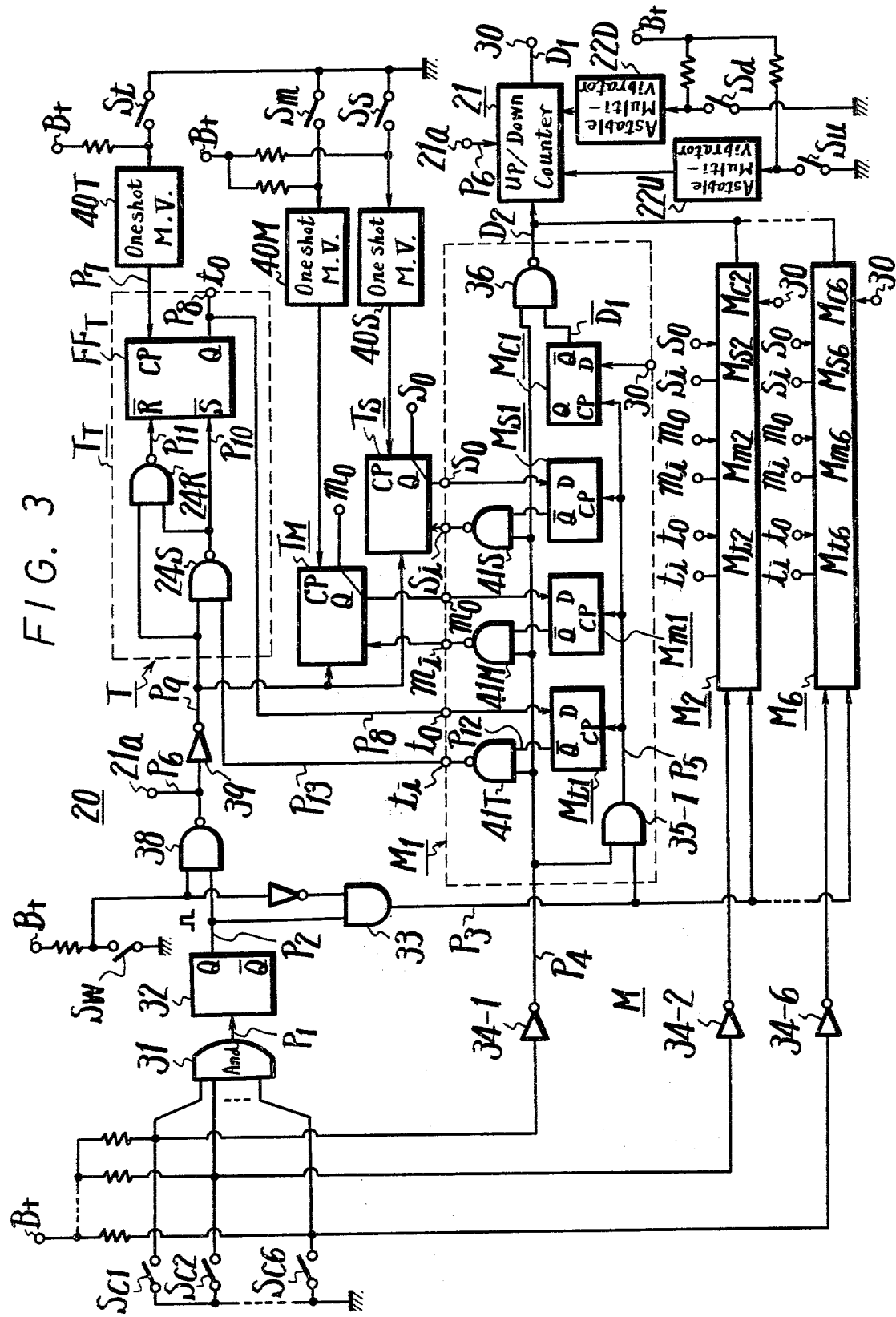
FIG. 3 is a partial block, partial logic diagram of one embodiment of the present invention.

Control circuit 20, described in greater detail hereinbelow with respect to FIG. 3, is adapted to produce and store a channel identity signal, such as a channel identity code $D_1$, and various control signals, such as control codes $D_3$. Channel identity code $D_1$ is a plural bit digital signal whose corresponding value establishes the dividing ratio of programmable frequency divider 12. Hence, this channel identity code $D_1$ represents the particular channel, or broadcast frequency, to which the illustrated signal receiving apparatus is tuned. As shown in FIG. 1, channel identity code $D_1$ is supplied to programmable frequency divider 12 and, additionally, this channel identity code is coupled to a decoder 18 whereat it is decoded and displayed on a digital display 19.

Control circuit 20 additionally includes a plurality of individual control signal generating and storage circuits, described below with respect to FIG. 3, for producing a selectivity control code, a mono/stereo control code and a muting control code, respectively. An output terminal $t_o$ is adapted to be supplied with the selectivity control code and to apply this code to IF stage 2a. As an example, the selectively control code may be a single-bit signal to select either a narrow or broad effective frequency band in the IF stage depending upon the condition of this bit. An output terminal $m_o$ is adapted to supply the mono/stereo control code to demodulator 2c. This code also may be a single-bit signal for determining whether the demodulator operates in its stereo or monaural demodulating mode, respectively. An additional output terminal $s_o$ is adapted to supply the muting control code, which also may be a single-bit signal, to demodulator 2c. Depending upon the state of this bit, the muting operation either may be selected or inhibited. As represented by the broken line in FIG. 1, the muting control code alternatively may be supplied to amplifier 3 in the event that the muting control circuit is connected to this amplifier.

The manner in which the apparatus illustrated in FIG. 1 operates will be described from the viewpoint of the user's operation thereof. This apparatus typically is provided with a control panel, such as control panel 5 shown in FIG. 2. This control panel is provided with a plurality of manually operable switches and visual indicators. These switches include a plurality of channel selector switches $S_{c1} \ldots S_{c6}$, tuner set-up control switches comprised of a count down switch $S_d$, and count up switch $S_u$ and a stop switch; a selectivity control switch $S_t$, a mono/stereo control switch $S_m$ and a muting control switch $S_s$; and a storage control switch shown herein as a write switch $S_w$. Visual indicators L, such as lamps, LED's, or the like, are associated with each of the respective switches. When a switch is operated to a particular condition, the visual indicator provides an indication of same. Also included in control panel 5 is digital display 19 which, for the purpose of the present discussion, is provided to present a numeric indication of an FM broadcast frequency to which the illustrated apparatus is tuned.

Control circuit 20 includes an up/down counter whose count is adapted to be incremented or decremented, depending upon whether count up switch $S_u$ or count down switch $S_d$ is operated. The count of this up/down counter corresponds to channel identity code $D_1$ and is supplied to programmable divider 12 for establishing the frequency divider ratio thereof. During a preset, or set-up, operation, the user will operate either the count up switch or the count down switch to change the count of the up/down counter accordingly. As the count of this counter changes, the frequency divider ratio of programmable frequency divider 12 correspondingly changes. Thus, the frequency of the frequency-divided local oscillating signal supplied to phase comparator 14 correspondingly changes. As this frequency changes, the phase comparator produces an error signal which is fed back to VCO 11 so as to correspondingly change the frequency of the oscillating signal generated thereby. Thus, as the count of the up/down counter changes, the tuning condition of the tuning section included in the illustrated signal receiving apparatus likewise changes. When the tuning section is tuned to a desired channel, the user operates the stop switch so as to terminate the incrementing or decrementing of the up/down counter. Thus, the count of this counter is maintained constant. This count, which corresponds to channel identity code $D_1$, is displayed on digital display 19. Also, and as is appreciated, the tuning section of the illustrated signal receiving apparatus remains tuned to the corresponding channel which is represented by this channel identity code $D_1$.

While listening to, or monitoring, the program received over the selected channel, the user may determine that various operating conditions of the illustrated signal receiving apparatus should be adjusted. For example, the user may decide that improved reception is obtained if the selectivity of IF stage 2a is made narrow. That is, improved reception may obtain if the effective frequency band of the IF stage is made narrow. Consequently, selectivity control switch $S_t$ may be operated. Also, the user may determine that the quality of the reproduced sound is improved if demodulator 2c is operated in its mono operating mode. Accordingly, mono/stereo control switch $S_m$ may be operated. Still further, the user may prefer the quality of the reproduced sound if the muting operation is not performed. To this effect, muting control switch $S_s$ may be operated. It should be appreciated that any one or more of the selectivity, mono/stereo and muting control switches may be operated in accordance with the user's preference. As a further alternative, none of these control switches may be operated.

After the user has determined that the tuning section is tuned to a desired channel, and that the optimum operating conditions of the illustrated signal receiving apparatus have been effected, the channel identity code, selectivity code, mono/stereo code and muting code all may be stored in a particular stage of a memory, or storage device. Accordingly, write switch $S_w$ is operated to enable the aforementioned channel identity, selectivity, mono/stereo and muting codes to be written into, and thus stored in, a selected memory stage. The user then operates one of channel selector switches $S_{c1} \ldots S_{c6}$ to select the particular memory stage into which these codes are stored. For the purpose of the present discussion, let it be assumed that these codes are stored in the first memory stage, that is, the memory stage associated with channel selector switch $S_{c1}$. Of course, if the user prefers not to store these codes, write switch $S_w$ and/or channel selector switch $S_{c1}$ need not be operated.

After the channel and control information is stored in the manner described above, the user may repeat the aforementioned operation so as to tune the tuning section of the illustrated signal receiving apparatus to another channel and then to effect the optimum operating conditions of the signal receiving apparatus therefor. Once a proper channel has been selected and the operating conditions have been established, channel identity code $D_1$ together with the selectivity, mono/stereo and muting codes, referred to collectively herein as control signals $D_3$, are stored in the memory stage selected by the operation of one of the remaining channel selector switches $S_{c2} \ldots S_{c6}$. As each memory stage is loaced with channel and control information, that is, as each memory stage is preset with this information, the associated indicator L is energized so as to apprise the user of which memory stages are occupied, or loaded with channel and control information, and which memory stages are available for the storage of subsequent channel and control information.

When the foregoing preset, or set-up operation is completed, the preset channel and control information stored in the respective memory stages are available for rapidly tuning the tuning section of the illustrated signal receiving apparatus to any one of the preset channels with optimum operating conditions. For example, let it be assumed that the user now wishes to receive the program broadcasted over the frequency associated with channel 1. Let it be further assumed that the channel and control information relating to channel 1 is stored in the memory stage associated with channel selector switch $S_{c1}$. The user operates this switch to read out this channel and control information. Hence, channel identity code $D_1$ is read out from the associated memory stage and supplied to programmable frequency divider 12. In accordance with the operation described above, the programmable frequency divider is set to a frequency divider ratio determined by channel identity code $D_1$, and the frequency of VCO 11 is controlled such that the tuning section is tuned to the broadcast frequency identified by channel identity code $D_1$. Also, when channel selector switch $S_{c1}$ is operated, control signals $D_3$, that is, the selectivity, mono/stereo and muting codes, are read out from the associated memory stage. The selectivity code appears at output terminal $t_o$ and is applied to IF stage 2a to determine the selectivity thereof. Similarly, the mono/stereo code is read out to output terminal $m_o$ and is applied therefrom to demodulator 2c so as to correspondingly determine the operating mode of this demodulator. Finally, the muting code is read out to output terminal $s_o$ and supplied therefrom to the demodulator (or to amplifier 3) so as to selectively enable or inhibit the muting operation.

When the user wishes to select a different channel for reception, any one of the remaining channel selector switches $S_{c2} \ldots S_{c6}$ is operated. This results in tuning the tuning section of the illustrated signal receiving apparatus to the channel represented by the read out channel identity code $D_1$; and also establishes the particular operating conditions determined by read out control signals $D_3$. Thus, it is seen that "one button" tuning with optimum operating conditions is achieved. There is no need to determine the selectivity, mono/stereo and muting conditions individually for each preset channel that is selected. Once the preset channel is selected, or read out from a respective memory stage, the appropriate operating conditions associated with that channel automatically are established.

Control circuit 20 is shown in greater detail in the partial block, partial logic diagram of FIG. 3. The control circuit is comprised generally of a memory device M and a preset circuit T. The purpose of the memory device is to store channel identity signals and control signals in respective stages thereof. The purpose of preset circuit T is to generate particular control signals, such as the selectivity, mono/stereo and muting codes, during a preset, or set-up, operation, and to receive these control signals and apply same to respective elements in the signal receiving apparatus during subsequent operation.

Memory device M is comprised of a plurality of memory sections $M_1 \ldots M_6$. Each memory section includes a channel code store $M_c$, a selectivity code store $M_t$, a mono/stereo code store $M_m$ and a muting code store $M_s$. In each memory section, the reference numerals which are used to identify the code stores are provided with the same numerical suffix as used in the reference numeral identifying the corresponding memory section. Thus, in memory section $M_1$, the channel code store is identified as $M_{c1}$, the selectivity code store is identified as $M_{t1}$, and so on. Each code store is a conventional storage device. For example, each code store is adapted to store all of the bits included in the respective channel identity code or control code and, hence, is formed of a number of triggerable flip-flop circuits to store such bits. As an example, if the channel identity code is assumed to be a four-bit code, then channel code store $M_{c1}$ is formed of four triggerable flip-flop circuits. In the interest of simplification, only a single triggerable flip-flop circuit is shown for channel code store $M_{c1}$, this triggerable flip-flop circuit including a data input terminal D, a trigger pulse input CP and an output $\bar{Q}$. Data input terminal D is adapted to receive the bit (or bits) included in the code signal applied thereto.

Similarly, selectivity code store $M_{t1}$, mono/stereo code store $M_{m1}$ and muting code store $M_{s1}$ all are capable of storing respective single-bit codes and, therefore, each store is formed of a triggerable flip-flop circuit having a data input terminal D, a trigger pulse input CP and an output $\bar{Q}$. An AND gate 35-1 is included in memory section $M_1$ and is adapted to supply a trigger pulse to each of the trigger pulse inputs CP of the illustrated code stores. Hence, the output of AND gate 35-1 is connected in common to the trigger pulse input CP of each of the channel, selectivity, mono/stereo and muting code stores.

Read-out NAND gates are connected to each of the $\bar{Q}$ outputs of the code stores shown in memory section $M_1$. NAND gate 36 includes one input connected to the $\bar{Q}$ output of channel code store $M_{c1}$ and another input connected to receive an enabling single, to be described. Similar NAND gates 41T, 41M and 41S each have one input connected to the $\bar{Q}$ output of the respective selectivity, mono/stereo and muting code stores $M_{t1}$, $M_{m1}$ and $M_{s1}$. The other input of each of these NAND gates is connected in common to receive the aforementioned enabling signal. The outputs of NAND gates 41T, 41M and 41S are connected to output terminals $t_i$, $m_i$ and $s_i$, respectively. These output terminals are connected to, and may be considered equivalent to, the input terminals of preset circuit T, as will be described. The output terminal of NAND gate 36 is connected to a load, or set, input of an up/down counter 21. It may be appreciated that if channel code store $M_{c1}$ is comprised of a plurality of triggerable flip-flop circuits, such as four flip-flop circuits to accommodate a four-bit channel identity code, NAND gate 36 may be comprised of four NAND gates, each having an input thereof connected to the Q output of the respective triggerable flip-flop circuits, and each having an enabling input connected in common to receive the aforementioned enabling signal. In such a construction, up/down counter 21 includes a plurality of load inputs, such as four load inputs, connected to the outputs of the respective NAND gates included in NAND gate 36.

The remaining memory sections $M_2 \ldots M_6$ are constructed to be substantially identical to memory section $M_1$. Hence, in the interest of brevity, further description of these additional memory sections is not provided. Nevertheless, memory sections $M_2 \ldots M_6$ are represented as the illustrated blocks.

Figure 2:
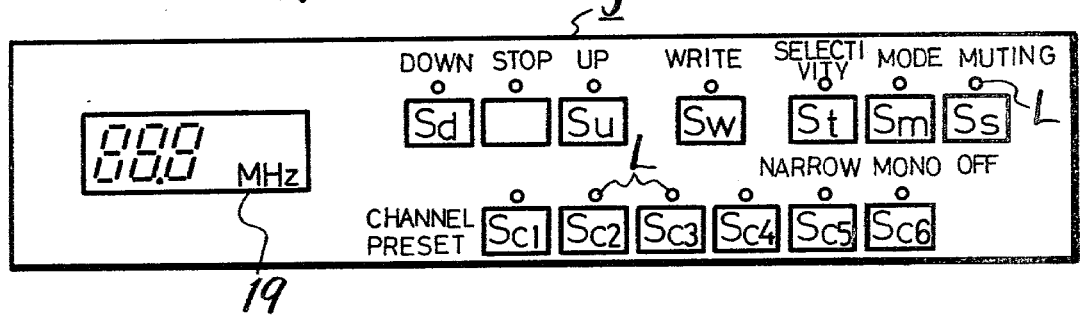
FIG. 2 is a front view of one embodiment of a control panel which can be used with the signal receiving apparatus shown in FIG. 1.

Up/down counter 21 includes a load input 21a as well as count-up and count-down inputs. If a load pulse is applied to load input 21a, the up/down counter is conditioned to store the channel identity code read out from channel code store $M_{c1}$. Thus, the count of up/down counter 21 is preset to the channel identity code supplied thereto in response to the application of a load pulse to load input 21a. The count-up and count-down inputs of up/down counter 21 are coupled to astable multivibrators 22U and 22D, respectively. Count-up switch $S_u$ and count-down switch $S_d$ are coupled to astable multivibrators 22U and 22D, respectively, and are adapted, when operated, to supply a reference potential, such as ground, thereto. When count-up switch $S_u$ is operated, for example, when this switch is closed, astable multivibrator 22U is energized to supply a train of count-up pulses to the count-up input of counter 21. Similarly, when count-down switch $S_d$ is operated, for example, when this switch is closed, astable multivibrator 22D is energized to supply a train of count-down pulses to the count-down input of counter 21. When the stop switch shown in FIG. 2 is operated, whichever one of the count-up and count-down switches that had been closed is opened. As is recognized, the count of up/down counter 21 is incremented in response to the train of count-up pulses supplied thereto, and this count is decremented in response to the train of count-down pulses which are supplied thereto.

Preset circuit T is comprised of individual preset circuits for generating the respective selectivity, mono/stereo and muting codes during a preset, or set-up, operation; and these individual preset circuits also are adapted to temporarily store the selectivity, mono/stereo and muting codes which are read out of memory sections $M_1 \ldots M_6$. Accordingly, preset circuit T is comprised of a selectivity preset circuit $T_T$, a mono/stereo preset circuit $T_M$ and a muting preset circuit $T_S$. Each of these preset circuits $T_T$, $T_M$ and $T_S$ is of substantially identical construction. Accordingly, in the interest of brevity, only selectivity preset circuit $T_T$ is shown and described in detail.

Selectivity preset circuit $T_T$ is comprised of a triggerable flip-flop circuit $FF_T$ including a trigger pulse input CP and set and reset inputs $\overline{S}$ and $\overline{R}$, respectively. A Q output also is provided. Triggerable flip-flop circuit $FF_T$ may be a J-K flip-flop device including so-called forced set and reset inputs. In the illustrated triggerable flip-flop circuit, if a binary "0" is applied to the $\overline{S}$ input, the flip-flop circuit is set, and a binary "1" is provided at its Q output. Conversely, if a binary "0" is applied to the $\overline{R}$ input, the flip-flop circuit is reset and a binary "0" is provided at its Q output. If a binary "1" is applied to both the $\overline{S}$ and the $\overline{R}$ inputs, the state of triggerable flip-flop circuit $FF_T$ is changed in response to each trigger pulse applied to its trigger pulse input CP. For the purpose of the present discussion, it will be assumed that a binary "1" is represented by a voltage of a relatively higher level and a binary "0" is represented by a voltage of a relatively lower level. Of course, and as may be appreciated, opposite voltage levels can be used to represent the binary "1" and "0". Also, and if desired, a binary "1" may be represented by a positive (or negative) voltage level and a binary "0" may be represented by a negative (or positive) voltage level.

The state of triggerable flip-flop circuit $FF_T$ is used to represent the single bit constituting the selectivity code. If the selectivity code is formed as a plural bit signal, it should be appreciated that a corresponding number of triggerable flip-flop circuits is used to generate this selectivity code. In the illustrated embodiment, the Q output of flip-flop circuit $FF_T$ is coupled to an output terminal $t_o$, and this output terminal is connected to the data input terminal D of selectivity code store $M_{t1}$.

A one-shot multivibrator, such as a monostable multivibrator 40T, has its output connected to the trigger pulse input CP of triggerable flip-flop circuit $FF_T$. The input of one-shot multivibrator 40T is selectively coupled to ground via selectivity control switch $S_t$. When this selectivity control switch is closed, one-shot multivibrator 40T is energized to generate a trigger pulse which is supplied to the trigger pulse input CP of flip-flop circuit $FF_T$, thereby changing the state of this flip-flop circuit provided that a binary "1" is applied to each of the $\overline{S}$ and $\overline{R}$ inputs.

Selectivity preset circuit $T_T$ additionally includes a pair of NAND gates 24S and 24R having their respective outputs connected to the set and reset inputs $\overline{S}$ and $\overline{R}$, respectively, of the flip-flop circuit. One input of each of NAND gates 24S and 24R is connected in common to receive a conditioning pulse supplied thereto from a read-out circuit formed of a NAND gate 38 connected to an inverter 39. Another input of NAND gate 24S is connected to an input terminal $t_i$ for receiving the selectively code which is read out from selectivity code store $M_{t1}$ by NAND gate 41T. In addition to being connected to the $\overline{S}$ input of triggerable flip-flop circuit $FF_T$, the output of NAND gate 24S is connected to the other input of NAND gate 24R. As will be appreciated, if a conditioning pulse is applied to each of NAND gates 24S and 24R, a binary "1" supplied to NAND gate 24S will be inverted thereby and applied as a binary "0" to the $\overline{S}$ input of triggerable flip-flop circuit $FF_T$. This binary "0" also is applied to NAND gate 24R to be inverted and supplied as a binary "1" to the $\overline{R}$ input of the triggerable flip-flop circuit. Conversely, if NAND gates 24S and 24R are conditioned by a conditioning pulse applied thereto, a binary "0" which is supplied to NAND gate 24S from NAND gate 41T is inverted and applied as a binary "1" to the $\overline{S}$ input of flip-flop circuit $FF_T$. This binary "1" also is applied to and inverted by NAND gate 24R to be supplied as a binary "0" to the $\overline{R}$ input of the flip-flop circuit.

Mono/stereo preset circuit TM is of substantially identical construction as selectivity preset circuit $T_T$ and is shown as including a trigger pulse input CP to receive a trigger pulse generated by a one-shot multivibrator 40M, the latter being energized by selectively closing mono/stereo control switch $S_m$. Mono/stereo preset circuit TM also includes an output terminal $m_o$ which is connected to the data input terminal D of mono/stereo code store $M_{m1}$. An input terminal $m_i$ of mono/stereo preset circuit TM is connected to NAND gate 41M to receive the mono/stereo code which is read out from mono/stereo code store $M_{m1}$. Another input of mono/stereo preset circuit is connected to the read-out circuit for receiving the same conditioning pulse which is applied to NAND gates 24S and 24R included in selectivity preset circuit $T_T$.

Muting preset circuit $T_S$ also is of substantially similar construction as selectivity preset circuit $T_T$. Hence, and as shown, the muting preset circuit includes a trigger pulse input CP to receive a trigger pulse generated by a one-shot multivibrator 40S in response to the closing of muting control switch $S_s$. The muting preset circuit additionally includes an output terminal $s_o$ which is connected to the data input terminal D of muting code store $M_{s1}$. An input terminal $s_i$ of muting preset circuit $T_S$ is connected to the output of NAND gate 41S to receive the muting code read out of muting code store $M_{s1}$. Muting preset circuit $T_S$ also is connected to the read-out circuit to receive the conditioning pulse which is supplied to the NAND gate 24S and 24R included in selectivity preset circuit $T_T$.

The gating pulse which is supplied to NAND gate 35-1 to enable memory section $M_1$ to store the channel identity and control codes is generated by a write-in circuit comprised of an AND gate 33 to which a gating pulse is applied and to which an enabling signal is applied during a write-in operation. In particular, write switch $S_w$ is adapted, when closed, to supply a ground potential, corresponding to a binary "0" to an inverter. The output of this inverter is coupled to the enabling input of AND gate 33. Thus, when write switch $S_w$ is closed, AND gate 33 is enabled to transmit the gating pulse which is applied thereto. This gating pulse is produced by a monostable multivibrator 32 which is triggered by a negative transition at the output of an AND gate 31. This AND gate includes a number of inputs equal to the number of channel selector switches. Channel selector switches $S_{c1} \ldots S_{c6}$ all are connected in common to ground potential, and each of these channel selector switches is further connected to a respective input of AND gate 31. Each input of AND gate 31 also is connected to a source of operating potential B+ via a pull-up resistor. If all of channel selector switches $S_{c1}$ ... $S_{c6}$ are open, a relatively higher voltage level corresponding to a binary "1" is applied to each input of AND gate 31. When any one of the channel selector switches is closed, a binary "0" is supplied thereby to the respective input of AND gate 31, thereby resulting in a negative transition at the output of this AND gate. This negative transition is applied as a trigger signal to monostable multivibrator 32, thereby triggering the monostable multivibrator to generate the aforementioned gating pulse. This gating pulse is applied to AND gate 33 of the write-in circuit and, additionally, to NAND gate 38 of the read-out circuit. As shown, the binary "0" produced when write switch $S_w$ is closed is applied directly to another input of NAND gate 38. Thus, NAND gate 38 is disabled during a write-in operation; but, when write switch $S_w$ is opened, this NAND gate is enabled to utilize the gating pulse generated by monostable multivibrator 32 to effect a read-out operation.

Channel selector switches $S_{c1}$ ... $S_{c6}$ also are connected to inverters 34-1 ... 34-6, respectively. The outputs of these inverters are connected to memory sections $M_1$ ... $M_6$. As shown more clearly with respect to memory section $M_1$, inverter 34-1 is connected to the enabling input of each of AND gate 35-1 and NAND gate 36, 41T, 41M and 41S.

Preset Channel Selection Operation

The operation of control circuit 20, shown in FIG. 3, now will be described in conjunction with presetting the channel identity code, reference being made to the waveform diagrams shown in FIGS. 4A–4K. Let it be assumed that, initially, none of channel selector switches $S_{c1}$ ... $S_{c6}$ is operated. If all of these switches are open, a binary "1" is applied to each input of AND gate 31, and this AND gate applies a binary "1" to monostable multivibrator 32. Hence, the monostable multivibrator remains in its quiescent state to supply a binary "0" to NAND gate 34. This binary "0" disables the NAND gate which, in turn, produces a binary "1" which is supplied to load input 21a of up/down counter 21. It is recognized that, in the absence of a load pulse applied to load input 21a, the up/down counter is responsive to a train of count-up or a count of count-down pulses that may be applied to its count-up and count-down inputs, respectively. If count-up switch $S_u$ is operated, astable multivibrator 22U functions to supply count-up pulses to up/down counter 21. As the count of this counter is incremented, the channel identity code $D_1$ supplied from counter 21 to output terminal 30 likewise is incremented. Consequently, the frequency divider ratio of programmable frequency divider 12 increases so as to sweep the tuning condition of the tuning section included in the illustrated signal receiving apparatus from a lower frequency range to a higher frequency range. It is appreciated that if count-down switch $S_d$ has been closed, count-down pulses would be applied to up/down counter 21, thereby decrementing the count thereof, and resulting in a sweep of the tuning condition of the tuning section from a higher frequency range toward a lower frequency range. In either event, as the tuning condition of the tuning section changes, the tuning section soon will be tuned to a broadcasted frequency, or channel. Suitable tuning indicating apparatus (not shown) may be provided to detect when the tuning section is tuned to a broadcasted frequency; and this indication also can be used to terminate the incrementing or decrementing or up/down counter 21. Thus, the channel identity code $D_1$, which corresponds to the contents of counter 21, now identifies the particular channel to which the tuning section is tuned.

Let it now be assumed that the channel identity code representing the received channel is to be stored in memory section $M_1$. That is, the content of up/down counter 21 is to be written into channel code store $M_{c1}$. It is appreciated that output terminal 30, which is coupled to the output of counter 21, also is coupled to the data input terminal D of channel code store $M_{c1}$. Accordingly, in order to store this channel identity code in the channel code store, write switch $S_w$ is closed at, for example, time $t_1$, as shown in FIG. 4A. This supplies a binary "0" to NAND gate 38, thereby disabling this NAND gate, and the binary "0" is inverted to be applied as a binary "1" to AND gate 33. At time $t_2$, channel selector switch $S_{c1}$ is closed. This applies a binary "0" to AND gate 31, thereby resulting in a negative transition trigger signal $P_1$ at the output of the AND gate, as shown in FIG. 4C. Trigger signal $P_1$ triggers monostable multivibrator 32 to produce the gating pulse $P_2$ shown in FIG. 4D. This gating pulse is transmitted through enabled AND gate 33 and supplied as a gating pulse $P_3$ (FIG. 4E) to AND gate 35-1.

It is recognized that gating pulse $P_3$ also is applied to AND gates 35-2 ... 35-6 (not shown) included in each of the remaining memory sections $M_2$ ... $M_6$, respectively. However, since only channel selector switch $S_{c1}$ had been closed, only this channel selector switch generates a binary "0". Therefore, only inverter 34-1 produces the enabling signal $P_4$ (FIG. 4F) to enable AND gate 35-1. This enabled AND gate thus transmits gating pulse $P_3$ therethrough as a trigger pulse $P_5$, shown in FIG. 4G. Trigger pulse $P_5$ is applied to the trigger pulse input CP of channel code store $M_{c1}$. Hence, the channel identity code $D_1$, produced by up/down counter 21, and supplied to channel code store $M_{c1}$, now is stored in the channel code store.

The enabling signal $P_4$ produced in response to the closing of channel selector switch $S_{c1}$ also is applied to NAND gate 36. Therefore, the channel identity code $D_1$, shown in FIG. 4H as, for example, a binary "0", not only is stored in channel code store $M_{c1}$ but also is read out therefrom via its $\overline{Q}$ output. It is appreciated that an inverted version $\overline{D}_1$ (FIG. 4I) of channel identity code $D_1$ is read out from the $\overline{Q}$ output of channel code store $M_{c1}$. This inverted version of the channel identity code is inverted and transmitted by enabled NAND gate 36 so as to be applied to the set input of up/down counter 21 as the read out channel identity code $D_2$ (FIG. 4J). Nevertheless, this read out channel identity code, even though it is equal to channel identity code $D_1$, is not yet stored in the up/down counter because load input 21a is not yet supplied with a load pulse.

Thus, it is appreciated that the closing of write switch $S_w$, followed by the closing of channel selector switch $S_{c1}$ is effective to store the generated channel identity code $D_1$ in channel code store $M_{c1}$ of memory section $M_1$. Thereafter, when channel selector switch $S_{c1}$ is opened, a binary "1" is restored to the respective input of AND gate 31, thereby terminating trigger signal $P_1$ (FIG. 4C). Also, inverter 34-1 once again is supplied with a binary "1" so as to terminate enabling signal $P_4$ (FIG. 4F). When this enabling signal is terminated, NAND gate 36 is disabled, and the output thereof is returned to its binary "1" level (FIG. 4J). Consequently, control circuit 20 is prepared either for another channel preset operation, or for a channel read-out operation, the latter serving to tune the tuning section of the illustrated signal receiving apparatus to one of the channels stored in a selected one of memory sections $M_1 \ldots M_6$.

Channel Read-Out Operation

Let it now be assumed that the user wishes to tune the tuning section to the channel stored in memory section $M_1$. This is achieved merely by operating channel selector switch $S_{c1}$. It is recalled that, when channel selector switch $S_{c1}$ is closed, a binary "0" (FIG. 4B) is produced thereby, thus resulting in trigger signal $P_1$ (FIG. 4C), gating pulse $P_2$ (FIG. 4D) and enabling signal $P_4$ (FIG. 4F). At this time, write switch $S_w$ is open. Therefore, a binary "1" is supplied therefrom to NAND gate 38, and this binary "1" is inverted so as to disable AND gate 33. This means that gating pulse $P_3$ is not transmitted by AND gate 33 to AND gate 35-1. Thus, when write switch $S_w$ is open, the closing of a channel selector switch does not result in a write-in operation.

It is recalled that channel identity code $D_1$ is stored in channel code store $M_{c1}$. The inverted version $\overline{D}_1$ of this stored channel identity code is applied from the $\overline{Q}$ output of channel code store $M_{c1}$ to NAND gate 36. When enabling signal $P_4$ is produced at time $t_3$ (FIG. 4F), the inverted channel identity code $\overline{D}_1$ is read out via NAND gate 36 and supplied to the set input of up-/down counter 21 as the read out channel identity code $D_2$ (FIG. 4J).

At the same time that the read out channel identity code $D_2$ is applied to up/down counter 21, the gating pulse $P_2$, generated by monostable multivibrator 32, is inverted and transmitted by NAND gate 38 as load pulse $P_6$ (FIG. 4K). This load pulse is supplied to load input 21a of up/down counter 21. Therefore, the up-/down counter is loaded with the read out channel identity code $D_2$. It is appreciated that this read out channel identity code is equal to the stored channel identity code $D_1$. Therefore, the count of up/down counter 21 now is set to be equal to the channel identity code $D_1$ stored in channel code store $M_{c1}$. As before, the contents of the up/down counter are used to establish the frequency divider ratio of programmable frequency divider 12. Consequently, the tuning section included in the illustrated signal receiving apparatus now is tuned to the channel represented by channel identity code $D_1$.

In the foregoing discussion, no reference has been made to the operating condition of the signal receiving apparatus. The manner in which desired operating conditions are preset, and the manner in which these preset conditions are used to control the signal receiving apparatus when a particular channel is selected now will be described.

Control Code Preset Operation

During the preset, or set-up operation when up-/down counter 21 either is incremented or decremented until the tuning section of the illustrated signal receiving apparatus is tuned to a desired channel, the optimum selectivity, mono/stereo and muting conditions are established for that channel. If the selectivity of the signal receiving apparatus is to be narrowed, the user operates selectivity control switch $S_t$ to apply ground potential to one-shot multivibrator 40T, as shown in FIG. 5C. This energizes the one-shot multivibrator to supply a trigger pulse $P_7$ (FIG. 5D) to the trigger pulse input CP of triggerable flip-flop circuit $FF_T$. At this time, monostable multivibrator 32 is in its quiescent state (FIG. 5G), so as to disable NAND gate 38. As a result thereof, NAND gate 38 supplies a binary "1" to inverter 39, and this binary "1" is inverted to disable NAND gates 24S and 24R. Hence, a binary "1" is applied to each of the set $\overline{S}$ and reset $\overline{R}$ inputs of triggerable flip-flop circuit $FF_T$, as shown in FIGS. 5N and 5O. Consequently, the trigger pulse $P_7$ changes the state of the triggerable flip-flop circuit, as shown in FIG. 5E. Thus, when the selectivity of the signal receiving apparatus is to be narrowed, the selectivity code $P_8$ (FIG. 5E) produced by, and stored in, triggerable flip-flop circuit $FF_T$ is a binary "1".

If the selectivity of the signal receiving apparatus is to be widened, selectivity control switch $S_t$ is operated once again, as shown in FIG. 5C, to trigger one-shot multivibrator 40T. This results in another trigger pulse $P_7$ (FIG. 5D) supplied to the trigger pulse input CP of triggerable flip-flop circuit $FF_T$. As a result thereof, the state of this flip-flop circuit is changed, and selectivity code $P_8$ now is changed over to a binary "0".

Similar operations of mono/stereo control switch $S_m$ and muting control switch $S_s$ result in a mono/stereo and muting code that may be either a binary "1" or a binary "0", depending upon the particular operation of these control switches. As examples, if the mono/stereo code is a binary "1", demodulator 2c (FIG. 1) is operated in its monaural mode. If the muting code is a binary "1", the muting operation is inhibited. Of course, if desired, the converse of the foregoing may obtain, whereby a stereo demodulation operation is performed if the mono/stereo code is a binary "1", and whereby the muting operation is performed if the muting code is a binary "1".

Let it be assumed that during the preset, or set-up operation, the user determines that the optimum operating conditions to receive the channel represented by the channel identity code stored in up/down counter 21 includes a binary "0" as the selectivity code $P_8$. In order to store this selectivity code (as well as the mono/stereo and muting codes), write switch $S_w$ is closed. This applies a binary "0" to NAND gate 38, thereby disabling the read-out circuit. However, this binary "0" is inverted and supplied as a binary "1" to enable AND gate 33 included in the write-in circuit. Now, if the selectivity, mono/stereo and muting codes are to be stored in memory section $M_1$, channel selector switch $s_{c1}$ is closed at, for example, time $t_2$. The closing of channel selector switch $S_{c1}$ applies a binary "0" to AND gate 31 and also to inverter 34-1. It is recalled that, in response thereto, AND gate 31 generates the trigger signal $P_1$ (FIG. 5F); and inverter 34-1 generates the enabling signal $P_4$ (FIG. 5I).

Trigger signal $P_1$ triggers monostable multivibrator 32 to generate the gating pulse $P_2$ (FIG. 5G). This gating pulse is transmitted by enabled AND gate 33 as the gating pulse $P_3$ (FIG. 5H) to AND gate 35-1. Since AND gate 35-1 is enabled by the enabling signal $P_4$, gating pulse $P_3$ is transmitted therethrough as trigger pulse $P_5$. This trigger pulse is supplied to the trigger pulse inputs CP of each of selectivity code store $M_{t1}$, mono/stereo code store $M_{m1}$ and muting code store $M_{s1}$.

Hence, the selectivity code which is stored in triggerable flip-flop circuit $FF_T$, and which is supplied from output terminal $t_o$ of selectivity preset circuit $T_T$ to the data input D of selectivity code store $M_{t1}$ is stored therein. Similarly, the mono/stereo code which is stored in the triggerable flip-flop circuit (not shown) included in mono/stereo preset circuit $T_M$ is supplied from output terminal $m_o$ to the data input terminal D of mono/stereo code store $M_{m1}$. Also, the muting code which is stored in the triggerable flip-flop circuit (not shown) included in muting preset circuit $T_S$ is supplied from its output terminal $s_o$ to the data input terminal D of muting code store $M_{s1}$.

Thus, it is seen that, during a preset, or set-up, operation, when write switch $S_w$ is closed and then channel selector switch $S_{c1}$ is closed, the channel identity code stored in up/down counter $21a$, the selectivity code generated in selectivity preset circuit $T_T$, the mono-stereo code generated in mono/stereo preset circuit $T_M$ and the muting code generated in muting preset circuit $T_S$ and loaded into channel code store $M_{c1}$, selectivity code store $M_{t1}$, mono/stereo code store $M_{m1}$ and muting code store $M_{s1}$, respectively, of memory section $M_1$. Of course, this channel identity and control information can be stored in any of the remaining memory sections $M_2 \ldots M_6$ provided that a corresponding one of channel selector switches $S_{c2} \ldots S_{c6}$ is operated.

In the foregoing discussion, it is assumed that selectivity code $P_8$ is a binary "0". The inverted version of this selectivity code thus appears at the Q output of selectivity code store $M_{t1}$, as shown by the inverted selectivity code $P_{12}$ in FIG. 5K. Since the enabling signal $P_4$ has been produced in response to the closing of channel selector switch $S_{c1}$, NAND gate 41T is enabled to invert the inverted version of the selectivity code, thus transmitting a read out selectivity code $P_{13}$, as shown in FIG. 5L. The read out selectivity code $P_{13}$ is supplied to the input terminal $t_i$ of selectivity preset circuit $T_T$. However, since NAND gates 24S and 24R are disabled during the preset operation, the read out selectivity code $P_{13}$ cannot be transmitted therethrough to triggerable flip-flop circuit $FF_T$.

It may be appreciated that the selectivity, mono/stereo and muting codes generated by selectivity preset circuit $T_T$, monostereo preset circuit $T_M$ and muting preset circuit $T_S$, respectively, are applied in common to all of memory sections $M_1 \ldots M_6$. However, only the one memory section which is associated with the particular channel selector switch that is closed will store this information.

Control Read-Out Operation

Let it now be assumed that the channel identity and control information corresponding to various predetermined channels has been stored in memory sections $M_1 \ldots M_6$, as desired. If the operator wishes to tune the tuning section to the channel stored in memory section $M_1$, channel selector switch $S_{c1}$ is operated, as discussed above. Of course, during this read-out operation, write switch $S_w$ remains open. Therefore, a binary "1" is supplied to NAND gate 38, thereby enabling this NAND gate. Also, this same binary "1" is inverted to distable AND gate 33, thereby disabling the write-in circuit.

When channel selector switch $S_{c1}$ is closed, such as at time $t_4$, a binary "0" is produced thereby, as shown in FIG. 5B. This results in a trigger signal $P_1$ applied to monostable multivibrator 32, thereby triggering this monostable multivibrator to generate the gating pulse $P_2$ (FIG. 5G). The gating pulse $P_2$ is inverted and transmitted by NAND gate 38 as load pulse $P_6$. It is recalled that this load pulse enables up/down counter 21 to be set to the read out channel identity code $D_2$ supplied thereto by channel code store $M_{c1}$. Load pulse $P_6$ also is inverted by inverter 39 and supplied as a conditioning pulse $P_9$ to NAND gates 24S and 24R included in selectivity preset circuit $T_T$, and also to similar NAND gates which are included in mono/stereo preset circuit $T_M$ and muting preset circuit $T_S$.

The enabling signal $P_4$ (FIG. 5I) produced when channel selector switch $S_{c1}$ is closed is supplied to each of NAND gates 41T, 41M and 41S. This enabling signal also is applied to AND gate 35-1, but has no effect thereon because AND gate 33 is disabled and, thus, supplies a binary "0" (FIG. 5H) thereto. Of course, and as described above, the enabling signal $P_4$ additionally is applied to enable NAND gate 36 to read out the inverted channel identity code $\overline{D}_1$ from channel code store $Mo_{c1}$.

Since each of NAND gates 41T, 41M and 41S is supplied with the enabling signal $P_4$, each of these NAND gates is enabled to read out the corresponding code supplied thereto from a respective code store. Thus, NAND gate 41T, which is supplied with inverted selectivity code $P_{12}$ (FIG. 5K) inverts this selectivity code to read out selectivity code $P_{13}$ (FIG. 5L), and applies this read out selectivity code to NAND gate 24S included in selectivity preset circuit $T_T$. Similarly, NAND gate 41M is enabled to read out the mono/stereo code from mono/stereo code store $M_{m1}$ to mono/stereo preset circuit $T_M$. Finally, NAND gate 41S is enabled to read out the muting code from muting code store $M_{s1}$ to muting preset circuit $T_S$.

In the example described herein, it is assumed that read out selectivity code $P_{13}$ is a binary "0", as shown in FIG. 5L. Since NAND gates 24S and 24R both are supplied with the conditioning pulse $P_9$ (FIG. 5M), both of these NAND gates are conditioned to transmit the read out selectivity code to triggerable flip-flop circuit $FF_T$. More particularly, since the read out selectivity code $P_{13}$ is assumed to be a binary "0", this read out selectivity code is inverted by conditioned NAND gate 24S to a binary "1". Hence, a binary "1" is supplied to the set input $\overline{S}$ of flip-flop circuit $FF_T$. This binary "1" is further inverted by conditioned NAND gate 24R to supply a binary "0" to the reset input $\overline{R}$ of triggerable flip-flop circuit $FF_T$. Thus, it is seen that a reset pulse $P_{11}$ (FIG. 5O) is supplied to the triggerable flip-flop circuit. Hence, this flip-flip circuit is reset so as to store the selectivity code $P_8$ (FIG. 5E) which has been assumed herein to be a binary "0". This, of course, is the very same selectivity code which had been stored in selectivity code store $M_{t1}$. This selectivity code, which now has been loaded into flip-flop circuit $FF_T$, is supplied to IF stage $2a$ to establish a corresponding selectivity condition.

In a similar manner, the mono/stereo code which had been stored in mono/stereo code store $M_{m1}$ is loaded into mono/stereo preset circuit $T_M$. This mono/stereo code is used to establish a corresponding demodulating operation in demodulator $2c$. Also, the muting code which had been stored in muting code store $M_{s1}$ is read out therefrom and loaded into muting preset circuit $T_S$. This muting code, which now is temporarily stored in the muting preset circuit, establishes a corresponding muting operation.

Thus, it is seen that when channel selector switch $S_{c1}$ is operated, the channel identity code which had been preset, or stored, in channel code store $M_{c1}$ of memory section $M_1$ is read out therefrom and loaded into up/down counter 22. This determines the particular channel to which the tuning section in the illustrated signal receiving apparatus is tuned. At the same time, the control information, that is, the selectivity, mono/stereo and muting codes, which are stored in memory section $M_1$ and which are determinative of the operating conditions of the signal receiving apparatus for the optimum reception of the tuned channel, are read out from this memory section and are used to establish such operating conditions. Of course, with each operation of a particular channel selector switch, the previously established channel identity code which had been stored in counter 21, and the previously established control signals which had been stored in the respective selectivity, mono/stereo and muting circuits are replaced with the new information which is read out from the memory section that is selected by the channel selector switch. It is appreciated that if, for example, the preset selectivity code had been a binary "1", then when the memory section in which this selectivity code is stored is selected, the binary "1" selectivity code is loaded into selectivity preset circuit $T_T$. Hence, it is recognized that output terminals $t_o$, $m_o$ and $s_o$ of selectivity, mono/stereo and muting preset circuits $T_T$, $T_M$ and $T_S$, respectively, each is connected in common to a data input terminal D of a respective selectivity, mono/stereo and muting code store included in each of memory sections $M_1 \ldots M_6$. Similarly, output terminal 30 of up/down counter 21 likewise is connected in common to the channelcode store $M_{c1}$ in each memory section $M_1 \ldots M_6$. Likewise, input terminal $t_i$ of selectivity preset circuit $T_T$ is connected in common to each NAND gate 41T in memory sections $M_1 \ldots M_6$ so as to receive the read out selectivity code therefrom. Similarly, input terminal $m_i$ of mono/stereo preset circuit is connected to NAND gate 41M in each memory section $M_1 \ldots M_6$. Likewise, input terminal $s_i$ of muting preset circuit $T_S$ is connected in common to each NAND gate 41S included in memory sections $M_1 \ldots M_6$. Finally, the set input of up/down counter 21 is connected in common to the outputs of NAND gates 36 in each of memory sections $M_1 \ldots M_6$. With these connections, the preset channel identity and control codes are supplied to all memory sections but are stored only in the one memory section that is selected by the operated channel selector switch. Also, the channel identity and control codes which are read out from any memory section are supplied to up/down counter 21 and to preset circuit T, respectively.

While the present invention has been particularly shown and described with reference to a peferred embodiment thereof, it should be readily apparent to one of ordinary skill in the art that various changes and modifications in form and details may be made without departing from the spirit and scope of the invention. For example, triggerable flip-flop circuit $FF_T$ and the various code stores have been described as J-K and D-type flip-flops. It should be recognized that other types of triggerable bi-state circuits can be used therefor, if desired. Also, the illustrated AND and NAND gates may be replaced by other gating circuits, as are known to those of ordinary skill in the art. Still further, although only six memory sections capable of storing channel identity and control information for six separate channels are illustrated, a greater or lesser number of memory sections may be provided. Still further, the control code may be comprised of any one or more of the aforementioned selectivity, mono/stereo and muting codes. Each of these codes may be a single-bit code, as described above, or may be formed of a plurality of bits. Still further, the control code may include various additional coded bits which are useful in establishing other operating parameters for the signal receiving apparatus so as to provide optimum receiving conditions when a particular preset channel is selected to be received. Also, the channel identity code may, if desired, comprise a BCD code capable of representing four decimal digits. Of course, a corresponding number of stages will be included in up/down counter 21 and in channel code store $M_{c1}$ to accommodate such a BCD code. Still further, although the illustrated apparatus has been described in the embodiment of the radio receiving device, it should be appreciated that other channels of information can be received by other conventional transmission techniques. It also should be appreciated that each of the code stores described herein may be constructed so as to maintain the respective codes preset therein even when the power supply of the apparatus is de-energized. This insures that the desired preset information is stored during periods of non-use without requiring the performance of a set-up operation each time that the user wishes to receive a predetermined channel.

Therefore, it is intended that the appended claims be interpreted as including the foregoing as well as various other modifications and changes.

What is claimed is:

1. Signal receiving apparatus comprising:
a tuning stage having presettable channel selecting storage means for storing selected channel identity signals representing predetermined channels to which said tuning stage is tunable, any of said stored channel identity signals being selectively read out to control the tuning condition of said tuning stage so as to be tuned to the channel represented by the read out channel identity signal;
a plurality of manually operable switches for selecting particular ones of said preset channels;
presettable memory means for storing control signals associated with said respective predetermined channels and each controlling at least one operating condition of said signal receiving apparatus, said presettable memory means including a plurality of memory stages for each storing at least one control signal associated with a respective preset channel, said manually operable switches being selectively operable to cause the channel identity signal representing a particular preset channel to be read out of said storage means and to cause said at least one control signal stored in a corresponding memory stage to be read out therefrom;
selectively operable preset means to generate at least one control signal to be stored in said memory means when said tuning stage is tuned to an associated channel during a preset operation, said preset means including selectively operable control code generating means for generating a control code representing at least one desired operating condition of said signal receiving apparatus when said tuning stage is tuned to a channel, said control code generating means including temporary storage means for temporarily storing the selectively generated control code, said temporarily stored control code being used to control said at least one condition of said receiving apparatus; means for supplying said control code to all of said memory stages; enabling means responsive to the operation of said manually operable switches to enable only the one memory stage corresponding to the channel selected by said switches to store said control code; and selectively operable write-in means for writing said control code into the enabled memory stage; and read-out means selectively operable to read out a particular stored channel identity signal from said storage means and also to read out said at least one control signal stored in said memory means and associated with the channel represented by said particular channel identity signal, wherein said read-out means comprises a plurality of gating means, each being connected to a respective memory stage and responsive to the selective operation of said manually operable switches to read out the control code stored in said respective memory stage to said temporary storage means.

2. The apparatus of claim 1 wherein said control code generating means generates plural control codes, each adapted to establish a respectively different operating condition of said signal receiving apparatus; each of said memory stages includes a plurality of memory sections for storing respective ones of said control codes; said temporary storage means includes a plurality of temporary storage sections for temporarily storing respective ones of said control code; and each of said gating means includes a plurality of gating sections connected to respective memory sections for selectively reading out said respective control codes stored in said memory sections to said temporary storage sections.

3. The apparatus of claim 2 wherein each of said control codes is a one-bit code; and said control code generating means comprises a plurality of manually operable control switches, each associated with a respective operating condition of said signal receiving apparatus, a plurality of pulse generating means, each coupled to a respective control switch for generating a pulse when said respective control switch is operated, and a plurality of bi-state circuits, each coupled to a respective pulse generating means for storing the pulse generated thereby, the selective presence or absence of said stored pulse being used to control a respective operating condition of said signal receiving apparatus, and each bi-state circuit constituting a respective one temporary storage section.

4. The apparatus of claim 3 wherein each memory section comprises a triggerable flip-flop circuit having a storage input terminal coupled to a respective one of said bi-state circuits and a trigger input coupled to said enabling means to receive a trigger pulse therefrom when said manually operable switches are operated to select the memory stage which includes said memory section and said write-in means is operated.

5. The apparatus of claim 2, 3, or 4 wherein said plural control codes are adapted to establish the selectivity, mono/stereo, and muting conditions of said signal receiving apparatus for each channel to which said tuning stage is tuned.

6. In signal receiving apparatus of the type including a tuning stage having presettable channel selecting storage means for storing selected channel identity signals representing predetermined channels to which said tuning stage is tunable, any of said stored channel identity signals being selectively read out to control the tuning condition of said tuning stage to be tuned to the channel represented by the read out channel identity signal, the improvement comprising presettable memory means for storing control signals associated with said respective predetermined channels, said control signals including at least selectivity control signals controlling the selectivity of said signal receiving apparatus, and representing the selectivity condition of said apparatus for respective ones of said predetermined channels; selectively operable present means to generate at least one said selectivity control signal to be stored in said memory means when said turning stage is turned to an associated channel during a preset operation; and read-out means selectively operable to read out a particular stored channel identity signal from said storage means and also to read out said one selectivity control signal stored in said memory means and associated with the channel represented by said particular channel identity signal.

7. Signal receiving apparatus comprising:
a turning stage to be turned to different channels for receiving programs broadcast over said different channels, said turning stage including a controllable oscillator for generating a local carrier whose frequency is determinative of the channel to which said turning stage is turned;
an IF stage coupled to said turning stage;
a demodulator stage coupled to said IF stage;
a plurality of memory stages each including a channel identity code section for storing a channel identity code representing a particular channel and a control code section for storing a control code representing at least one operating condition of said signal receiving apparatus wherein said control code comprises a plural-bit code, each bit being associated with a respective operating condition of said signal receiving apparatus;
up-down counter means selectively operable to increment or decrement the count thereof, the count of said up-down counter means corresponding to said channel identity code;
means for controlling the frequency of said controllable oscillator as a function of the contents of said up-down counter means;
a plurality of manually operable channel selector switches, each associated with a respective memory stage and operable to select that stage for the writing in or reading out of channel identity and control codes;
write-in means selectively operable to establish a write-in operation;
control code generating means selectively operable by an operator of said signal receiving apparatus to generate a control code for establishing a desirable operating condition of said signal receiving apparatus when said tuning stage is tuned to the channel represented by said count of said up-down counter means, said control code generating means including a number of manually operable control selector switches equal to the number of bits in said control code, a pulse generator and a flip-flop circuit for each of said control selector switches, each control selector switch being coupled to the respective pulse generator for triggering the same to produce a pulse when said switch is energized and a pulse when said switch is de-energized, and each pulse generator being coupled to the respective triggerable flip-flop circuit to trigger said flip-flop circuit between first and second states in response to each generated pulse, the state of said respective flip-flop circuit being determinative of the corresponding bit in said control code and being used to control a respective operating condition;

write enabling means responsive to the operation of one of said channel selector switches and to the operation of said write-in means for causing the count of said up-down counter means and the generated control code to be written into the channel identity and control code sections, respectively, of the memory stage selected by said one channel selector switch; and read-out means responsive to the operation of one of said channel selector switches and to the absence of operation of said write-in means for causing the channel identity code stored in the channel identity section of the memory stage selected by the operated channel selector switch to be read out therefrom and loaded into said up-down counter means, and for causing the control code stored in the control code section of said memory stage selected by said channel selector switch to be read out therefrom and used to establish a corresponding operation condition of said signal receiving apparatus 8. The apparatus of claim 7 wherein said read-out means includes a respective gating means coupled to a respective memory stage, each gating means comprising a number of gate circuits equal to the number of bits in said control code, each gate circuit having a code bit input connected to receive a respective bit of said control code stored in the control code section of said memory stage and an enable input connected to receive an enable signal when a respective channel selector switch is operated; a gate pulse generator for generating a gate pulse when said respective channel selector switch is operated; a number of flip-flop input circuits equal to the number of bits in said control code, a respective input circuit connected in common to the output of a respective gate circuit coupled to each memory stage, said respective input circuit being respective to said gate pulse and to the absence of operation of said write-in means for loading a respective flip-flop circuit with the control code bit read out of the respective memory stage.

9. The apparatus of claim 8 wherein said write-in means comprises a selectively operable write-in switch operable to produce a write enable signal; a respective energizable write gate coupled to a respective memory stage for supplying a write-in pulse thereto; and means for energizing said respective write gate with said enable signal and said gate pulse when said write enable signal is produced so as to load the states of said flip-flop circuits and the contents of said up-down counter means into the control code and channel identity sections respectively, of said respective memory stage.

10. In signal receiving apparatus of the type including a tuning stage having presettable channel selecting storage means for storing selected channel identity signals representing predetermined channels to which said tuning stage is tunable, any of said stored channel identity signals being selectively read out to control the tuning condition of said tuning stage to be tuned to the channel represented by the read out channel identity signal, the improvement comprising presettable memory means for storing control signals associated with said respective predetermined channels, said control signals including at least mono/stereo control signals controlling the mono/stereo condition of said signal receiving apparatus and representing the mono/stereo condition of said apparatus for respective ones of said predetermined channels; selectively operable preset means to generate at least one said mono/stereo control signal to be stored in said memory means when said turning stage is tuned to an associated channel during a preset operation; and read-out means selectively operable to read out a particular stored channel identity signal from said storage means and also to read out said one mono/stereo control signal stored in said memory means and associated with the channel represented by said particular channel identity signal.

11. In signal receiving apparatus of the type including a tuning stage having presettable channel selecting storage means for storing selected channel identity signals representing predetermined channels to which said tuning stage is tunable, any of said stored channel identity signals being selectively read out to control the tuning condition of said tuning stage to be tuned to the channel represented by the read out channel identity signal, the improvement comprising presettable memory means for storing control signals associated with said respective predetermined channels, said control signals including at least muting control signals controlling the muting condition of said signal receiving apparatus and representing the muting condition of said apparatus for respective ones of said predetermined channels; selectively operable present means to generate at least one said muting control signal to be stored in said memory means when said tuning stage is turned to an associated channel during a preset operation; and read-out means selectively operable to read out a particular stored channel identity signal from said storage means and also to read out said one muting control signal stored in said memory means and associated with the channel represented by said particular channel identity signal.

* * * * *